(12) United States Patent
Blauvelt et al.

(10) Patent No.: US 9,564,733 B2
(45) Date of Patent: Feb. 7, 2017

(54) METHOD OF FABRICATING AND OPERATING AN OPTICAL MODULATOR

(71) Applicant: EMCORE Corporation, Alhambra, CA (US)

(72) Inventors: Henry A. Blauvelt, San Marino, CA (US); Xiaoguang He, Diamond Bar, CA (US); Kerry Vahala, Pasadena, CA (US)

(73) Assignee: EMCORE CORPORATION, Alhambra, CA (US)

( * ) Notice: Subject to any disclaimer, the term of this patent is extended or adjusted under 35 U.S.C. 154(b) by 0 days.

(21) Appl. No.: 15/090,565

(22) Filed: Apr. 4, 2016

(65) Prior Publication Data

US 2016/0248223 A1    Aug. 25, 2016

Related U.S. Application Data

(63) Continuation-in-part of application No. 14/620,010, filed on Feb. 11, 2015, now Pat. No. 9,306,372.

(Continued)

(51) Int. Cl.
*H01S 3/10* (2006.01)
*H01S 5/042* (2006.01)
(Continued)

(52) U.S. Cl.
CPC .............. *H01S 5/042* (2013.01); *G02F 1/0121* (2013.01); *G02F 1/01708* (2013.01);
(Continued)

(58) Field of Classification Search
CPC ........ H01S 5/0265; H01S 5/026; H01S 5/042;
H01S 5/0425; H01S 5/0427; H01S 5/34306; H01S 5/1028; H01S 5/06251
See application file for complete search history.

(56) References Cited

U.S. PATENT DOCUMENTS 4,573,158 A    2/1986  Utaka et al.
4,798,437 A *  1/1989  Rediker ............. G02B 6/12011
                                                    250/201.2

(Continued)

FOREIGN PATENT DOCUMENTS

EP    0 556 974      8/1993
EP    0627798 A1    12/1994
(Continued)

OTHER PUBLICATIONS

Sahara et al; Single contact monolithically integrated DFB laser amplifier; IEEE Photonics Technology Letters, vol. 14, No. 7, pp. 899-901; Jul. 2002; doi: 10.1109/LPT.2002.1012378.
(Continued)

*Primary Examiner* — Kinam Park
(74) *Attorney, Agent, or Firm* — David S. Alavi

(57) ABSTRACT

A semiconductor device comprising a substrate; a monolithic gain region disposed on the substrate and operable to produce optical gain in response to current injection, including a first electrode over a first portion of the gain region having a first length $L_1$, with a first current $I_1$ being applied; and a second electrode over a second portion of the gain region having a second length $L_2$, with a second current $I_2$ being applied; wherein $I_1/L_1$ is greater than $I_2/L_2$.

36 Claims, 10 Drawing Sheets

Related U.S. Application Data

(60) Provisional application No. 62/050,347, filed on Sep. 15, 2014.

(51) Int. Cl.

| | | |
|---|---|---|
| *H01S 5/343* | (2006.01) | |
| *H01S 5/10* | (2006.01) | |
| *H01S 5/026* | (2006.01) | |
| *G02F 1/01* | (2006.01) | |
| *G02F 1/017* | (2006.01) | |
| *G02F 1/025* | (2006.01) | |
| *H01S 5/0625* | (2006.01) | |
| *H01S 5/50* | (2006.01) | |
| *H04B 10/2575* | (2013.01) | |
| *H04B 10/516* | (2013.01) | |
| *B82Y 20/00* | (2011.01) | |

(52) U.S. Cl.
CPC .............. *G02F 1/025* (2013.01); *H01S 5/026* (2013.01); *H01S 5/0265* (2013.01); *H01S 5/0425* (2013.01); *H01S 5/0427* (2013.01); *H01S 5/06251* (2013.01); *H01S 5/1028* (2013.01); *H01S 5/34306* (2013.01); *H01S 5/5027* (2013.01); *H04B 10/2575* (2013.01); *H04B 10/516* (2013.01); *B82Y 20/00* (2013.01); *Y10S 977/755* (2013.01); *Y10T 29/49002* (2015.01)

(56) References Cited

U.S. PATENT DOCUMENTS

| | | |
|---|---|---|
| 4,905,253 A | 2/1990 | Chraplyvy et al. |
| 5,020,153 A | 5/1991 | Choa et al. |
| 5,119,393 A | 6/1992 | Oka et al. |
| 5,170,402 A | 12/1992 | Ogita et al. |
| 5,228,049 A | 7/1993 | Paoli |
| 5,255,276 A | 10/1993 | Tabuchi et al. |
| 5,373,385 A | 12/1994 | Darcie et al. |
| 5,432,123 A | 7/1995 | Dentai et al. |
| 5,590,145 A | 12/1996 | Nitta |
| 5,680,411 A | 10/1997 | Ramdane et al. |
| 5,699,179 A | 12/1997 | Gopalakrishnan |
| 5,790,581 A | 8/1998 | Nitta |
| 5,926,493 A | 7/1999 | O'Brien et al. |
| 5,960,014 A | 9/1999 | Li et al. |
| 5,991,323 A | 11/1999 | Adams et al. |
| 6,031,860 A | 2/2000 | Nitta et al. |
| 6,167,172 A | 12/2000 | Kunkee et al. |
| 6,646,775 B2 | 11/2003 | Ishizaka |
| 6,700,910 B1 | 3/2004 | Aoki et al. |
| 7,437,029 B2 | 10/2008 | Joyner et al. |
| 7,573,928 B1 | 8/2009 | Pezeshki |
| 7,680,169 B2 | 3/2010 | Park et al. |
| 7,991,291 B2 | 8/2011 | Matsui et al. |
| 9,059,801 B1 | 6/2015 | Blauvelt et al. |
| 9,306,372 B2 | 4/2016 | Blauvelt et al. |
| 9,306,672 B2 | 4/2016 | Blauvelt et al. |
| 2002/0097941 A1* | 7/2002 | Forrest ................. H01S 5/0265 385/1 |
| 2002/0131466 A1 | 9/2002 | Salvatore et al. |
| 2002/0158266 A1 | 10/2002 | Sato et al. |
| 2003/0063646 A1 | 4/2003 | Yoshida |
| 2003/0091086 A1 | 5/2003 | Sahara et al. |
| 2003/0185257 A1 | 10/2003 | Suzuki et al. |
| 2003/0210723 A1 | 11/2003 | Adams et al. |
| 2004/0081212 A1 | 4/2004 | Schrodinger |
| 2004/0218931 A1 | 11/2004 | Frederiksen et al. |
| 2004/0228384 A1 | 11/2004 | Oh et al. |
| 2004/0228637 A1 | 11/2004 | Lee et al. |
| 2005/0013332 A1 | 1/2005 | Kish et al. |
| 2005/0018732 A1 | 1/2005 | Bond et al. |
| 2005/0041699 A1 | 2/2005 | White et al. |
| 2005/0249509 A1 | 11/2005 | Nagarajan et al. |
| 2006/0045145 A1 | 3/2006 | Arahira |
| 2006/0120416 A1 | 6/2006 | Hu et al. |
| 2006/0209911 A1* | 9/2006 | Takabayashi ....... H01S 5/06256 372/20 |
| 2006/0285570 A1 | 12/2006 | Xuan et al. |
| 2007/0116398 A1 | 5/2007 | Pan et al. |
| 2007/0134002 A1 | 6/2007 | Arahira |
| 2008/0025358 A1 | 1/2008 | Arahira |
| 2008/0138088 A1 | 6/2008 | Welch et al. |
| 2008/0219315 A1 | 9/2008 | Makino et al. |
| 2008/0291952 A1 | 11/2008 | Yamamoto et al. |
| 2010/0014874 A1* | 1/2010 | Kawanishi .............. G02F 1/225 398/187 |
| 2010/0266289 A1 | 10/2010 | Devgan et al. |
| 2011/0091146 A1 | 4/2011 | Knights et al. |
| 2011/0134957 A1 | 6/2011 | Su et al. |
| 2011/0150484 A1 | 6/2011 | Wang |
| 2012/0002694 A1 | 1/2012 | Bowers et al. |
| 2012/0099185 A1* | 4/2012 | Yokoyama ............. B82Y 20/00 359/340 |
| 2012/0128375 A1 | 5/2012 | Kimoto et al. |
| 2012/0163405 A1 | 6/2012 | Su et al. |
| 2012/0243874 A1 | 9/2012 | Logan et al. |
| 2013/0021891 A1 | 1/2013 | Fujita et al. |

FOREIGN PATENT DOCUMENTS

| | | |
|---|---|---|
| EP | 0917260 A1 | 5/1999 |
| JP | 2012-094622 A | 5/2012 |
| WO | WO 02/058251 | 7/2002 |

OTHER PUBLICATIONS

Maywar et al; Effect of chirped gratings on reflective optical bistability in DFB semiconductor laser amplifiers; IEEE Journal of Quantum Electronics, vol. 34, No. 12, pp. 2364-2370; Dec. 1998; doi: 10.1109/3.736108.

Brosson; Semiconductor lasers and integrated devices; EDP Sciences 2002; DOI: 10.1051/bib-sfo:2002059; pp. 1-53.

Thedrez et al; Power and facet phase dependence of chirp for index and gain-coupled DFB lasers; IEEE 16th International Semiconductor Laser Conference, Oct. 4-8, 1998. ISLC 1998 NARA, pp. 175-176; doi: 10.1109/ISLC.1998.734193.

Jabbari et al; XPM Response of Multiple Quantum Well chirped DFB-SOA All Optical Flip-Flop Switching; World Academy of Science, Engineering & Technology 56 2009 pp. 696-700.

Woodward et al; A method for reducing multipath interference noise; IEEE Photonics Technology Letters, vol. 6, No. 3, pp. 450-452; Mar. 1994; doi: 10.1109/68.275515.

Co-owned U.S. Appl. No. 14/740,241, filed Jun. 15, 2015 in the names of Blauvelt et al.

Co-owned U.S. Appl. No. 15/090,565, filed Apr. 4, 2016 in the names of Blauvelt et al.

Search Report dated Oct. 5, 2015 in counterpart App No. EP 14020022.

Gerlach et al; Indium Phosphide & Related Materials Conf 2005; May 8, 2005; pp. 554-557; DOI:10.1109/ICIPRM.2005.1517557.

He; IEEE Photonoc Technology Letters; vol. 19 No. 5 p. 1041 (Mar. 1, 20007).

Search Report dated Nov. 30, 2015 in co-owned App No. PCT/US2015/050161.

\* cited by examiner

METHOD OF FABRICATING AND OPERATING AN OPTICAL MODULATOR

BENEFIT CLAIMS TO RELATED APPLICATIONS

This application is a continuation-in-part of U.S. non-provisional application Ser. No. 14/620,010 filed Feb. 11, 2015 in the names of Henry A. Blauvelt, Xiaoguang He, and Kerry Vahala (now U.S. Pat. No. 9,306,372), which in turn claims benefit of U.S. provisional App. No. 62/050,347 filed Sep. 15, 2014 in the name of Henry A. Blauvelt. Each of said applications are incorporated by reference as if fully set forth herein.

FIELD OF THE INVENTION

This invention relates to an optical transmission system for analog or digital radio frequency (RF) signals using an externally modulated solid-state laser, and in particular to an optical modulator fabricated with and coupled to such a laser.

BACKGROUND

This application is related to subject matter disclosed in: (i) U.S. non-provisional App. No. 13/831,334 filed Mar. 14, 2013 in the names of Henry A. Blauvelt, Xiaoguang He, and Kerry Vahala (now U.S. Pat. No. 9,059,801); (ii) U.S. non-provisional application Ser. No. 14/086,112 filed Nov. 21, 2013 in the names of Henry A. Blauvelt, Xiaoguang He, and Kerry Vahala (now U.S. Pat. No. 9,306,672); (iii) U.S. non-provisional application Ser. No. 14/740,241 filed Jun. 15, 2015 in the names of Henry A. Blauvelt, Xiaoguang He, and Kerry Vahala; and (iv) U.S. non-provisional application Ser. No. 15/081,575 filed Mar. 25, 2016 in the names of Henry A. Blauvelt, Xiaoguang He, and Kerry Vahala. Each of said applications is incorporated by reference as if fully set forth herein.

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the high capacity (i.e., bandwidth) offered by optical fibers. Essentially, each channel has its own wavelength, and all wavelengths are separated enough to prevent overlap. International Telecommunications Union (ITU) standards currently determines the channel separations.

One link of an optical telecommunication system typically has a transmitter, the optical fiber, and a receiver. The optical transmitter has a laser, which converts an electrical signal into the optical signal and launches it into the optical fiber. The optical fiber transports the optical signal to the receiver. The receiver converts the optical signal back into an electrical signal.

Optical transmitters for the transmission of analog or digital radio-frequency (RF) signals over an optical fiber may use either a directly modulated laser or a continuous wave (CW) laser coupled to an external modulator.

Directly modulating the analog intensity of a light-emitting diode (LED) or semiconductor laser with an electrical signal is considered among the simplest methods known in the art for transmitting analog signals, such as voice and video signals, over optical fibers. Although such analog transmission techniques have the advantage of substantially smaller bandwidth requirements than digital transmission, such as digital pulse code modulation, or analog or pulse frequency modulation, the use of amplitude modulation typically places more stringent requirements on the noise and distortion characteristics of the transmitter. A limiting factor in such links can be the second order distortion due to the combination of optical frequency modulation, or chirp, and fiber dispersion.

For these reasons, direct modulation techniques have typically been used in connection with 1310 nm lasers where the application is to short transmission links that employ fiber optic links with low dispersion. It is also possible to use direct modulation of 1550 nm lasers, but in this case the distortion produced by chirp and dispersion must be cancelled using a predistorter that is set for the specific fiber length. In some case, such as when the signal must be sent to more than one location or through redundant fiber links of different length, such a programmable predistorter can be undesirable.

Stimulated Brillouin scattering (SBS) effects that depend on the optical launch power and the total fiber length may also degrade DWDM system performance. SBS is an opto-acoustic nonlinear process that can occur in single mode optical fibers. This optically induced acoustic resonance effectively limits the amount of optical power that can be successfully transmitted through the single mode optical fiber.

The SBS can perhaps be best explained in terms of three waves in an optical fiber. When an incident wave (also known as "pump wave") propagating along the optical fiber reaches a threshold power (which may vary), it excites an acoustic wave in the optical fiber. The optical properties of the optical fiber such as the refractive index are altered by the acoustic wave, and the fluctuation in the refractive index scatters the incident wave, thereby generating a reflected wave (also known as "Stokes wave") that propagates in the opposite direction.

Because of the scattering, power is transferred from the incident wave to the reflected wave, and molecular vibrations in the optical fiber absorb the lost energy, because of which, the reflected wave has a lower frequency than the incident wave. Hence, the scattering effect can result in attenuation, power saturation and/or backward-propagation, each of which deteriorates the DWDM system performance. Hence, the attenuation is caused by the transfer of power from the incident wave to the acoustic and reflected waves. Due to power saturation, there is a limit to the maximum amount of power that can be transmitted over the optical fiber. Also, the backward propagation wave can create noise in transmitters and saturate amplifiers.

The phenomenon of SBS has been known by optical network equipment designers for a number of years. Essentially, SBS results when a threshold power level is exceeded within a sufficiently narrow frequency band in a fiber optic light guide. The increasing operational relevance of SBS relates to the development of lasers such as, for example, single longitudinal mode lasers which readily provide an output that exceeds the SBS threshold (typically about 4 mW in, for example, a 50 kilometer fiber optic cable).

Moreover, limitation of optical power to a level as low as 4 mW not only fails to utilize the output power available from state of the art lasers, but limits distance transmission through fiber optic cable by an unacceptable margin.

Various approaches to minimize the effect of SBS are also known. In general, SBS impact can be reduced in an externally modulated analog system if the optical signal's spectrum can be broadened since the energy per bandwidth is lowered. Some effective and widely used techniques for combating SBS include the use of an optical phase modulator or dithering the laser or the combination of both, in the case of external modulators.

To avoid the distortion problems related to chirp and dispersion at 1550 nm with direct modulation, low chirp external optical modulators are commonly used in analog fiber optic communication systems, such as CATV signal distribution, to amplitude modulate an optical carrier with an information or content-containing signal, such as audio, video, or data signals.

Since the present disclosure also relates to external optical modulators associated with a laser, a brief background on external optical modulators is noted here. There are two general types of external optical modulators implemented as semiconductor devices known in the prior art: Mach Zehnder modulators and electro-absorption modulators. A Mach-Zehnder modulator splits the optical beam into two arms or paths on the semiconductor device, one arm of which incorporates a phase modulator. The beams are then recombined which results in interference of the two wavefronts, thereby amplitude modulating the resulting light beam as a function of the modulated bias signal applied to the phase modulated arm. An electro-absorption modulator is implemented as a waveguide in a semiconductor device in which the absorption spectrum in the waveguide is modulated by an applied electric bias field, which changes the band gap energy in that region of the semiconductor, thereby modulating the amplitude or intensity of the light beam traversing the waveguide.

SUMMARY

Objects of the Disclosure

It is an object of the present invention to provide an improved optical transmission system using an externally modulated laser.

It is another object of the present invention to provide an electro-optical modulator for use in an externally modulated 1550 nm optical transmission system with high power and good linearity using a modulated semiconductor saturable absorber.

It is still another object of the present invention to provide a highly linear optical transmission system suitable for long haul dispersive optical fiber media using an externally modulated laser with a predetermined bias, and an optical modulator with a lower electrical bias.

It is still another object of the present invention to provide an optical modulator having a waveguide region operated in a positive voltage, negative current characteristic region suitable for use in an analog optical transmission system using long haul dispersive optical fiber media.

It is also an object of the present invention to provide a method for biasing a semiconductor waveguide region in an electro-optical modulator in a broadband analog optical transmission system so that carriers are excited into a conduction band and are extracted from the semiconductor by an electrical field.

It is also an object of the present invention to provide a method for fabricating an optical modulator by estimating the gain peak wavelength of the semiconductor material, and fabricating the modulator with a material composition of the quantum well region so that the modulator has an operating wavelength below that of the estimated gain peak wavelength of the semiconductor material.

It is also an object of the present invention to provide a method for fabricating an optical modulator by determining the material composition of the quantum well region so that the modulator is transparent at an estimated gain peak wavelength that is greater than the predetermined wavelength by a predetermined amount.

It is also an object of the present invention to provide a method for fabricating an optical modulator by using an electroluminescence measurement to determine the material composition or estimate the gain peak wavelength of the quantum well region prior to fabrication of the grating of the laser.

It is also an object of the present invention to provide a method for fabricating an integrated laser and optical modulator fabricating of the grating of the laser so that the estimated gain peak wavelength associated with the modulator portion of the structure is at least 10 nm less than the wavelength of the light beam from the laser.

It is an object of the present invention to provide SBS suppression in an integrated laser and optical modulator.

It is still another object of the disclosure to provide an electrically adjustable biasing element for setting the level of SBS suppression in a laser semiconductor device.

It is still another object of the disclosure to provide a 2.4 GHz signal applied to an electrode of the laser for SBS suppression, a 10 MHz signal applied to the electrode of the laser for SBS suppression, or both.

It is also an object of the present invention to provide a method for biasing a semiconductor waveguide region in the laser portion of an integrated laser and optical modulator.

It is also an object of the present invention to provide a method for biasing a monolithic gain region forming a first semiconductor region including a first electrode over a first portion of the gain region having a first length $L_1$, with a first current $I_1$ being applied; and a second electrode over a second portion of the gain region having a second length $L_2$, with a second current $I_2$ being applied. It is also an object of the present invention in some instances to apply an information-containing, electrical RF modulation signal to the second electrode along with the second current $I_2$.

It is also an object of the present invention to provide a method for biasing a semiconductor waveguide region in the laser portion of an integrated laser and optical modulator with a fixed frequency signal for suppressing SBS.

Some implementations or embodiments may achieve fewer than all of the foregoing objects.

Features of the Invention

Briefly, and in general terms, the present disclosure provides a method of operating an optical modulator including a semiconductor device having an optical input for receiving a continuous wave coherent light beam having a predetermined power, a waveguide for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, including applying a continuous wave (cw) coherent light beam to the optical input; and applying a bias voltage to the electrode so that the coherent light beam is optically modulated by the signal modulating the absorption characteristic in the semiconductor device so that the waveguide operates in the absorption region at wavelengths less than the estimated gain peak wavelength.

In some embodiments, the modulator generates electrical current from the photovoltaic effect, the current being withdrawn or extracted from the modulator.

In some embodiments, the carrier density along the length of the semiconductor modulator in the direction of the optical beam is modulated, thereby optically modulating the cw optical beam entering the modulator.

In some embodiments, the estimated gain peak wavelength of the optical signal as a function of wavelength is at least 10 nm greater than the wavelength of the cw optical beam.

In some embodiments, the semiconductor device is operated in the negative current region of the I-V characteristic.

In some embodiments, the estimated gain peak wavelength associated with the modulator is between 20 and 40 nm greater than the wavelength of the light applied to the modulator.

In some embodiments, the bias is in the range of 0.6 to 1.0 volts with the coherent light beam being applied to the optical input.

In some embodiments, the bias is in the range of 0.7 to 0.9 volts with the coherent light beam being applied to the optical input.

In some embodiments, the bias is in the range of 0.85 to 1.05 volts with the coherent light beam being applied to the optical input.

In some embodiments, the bias is 0.8 volts with the coherent light beam being applied to the optical input.

In some embodiments, the bias is 0.95 volts with the coherent light beam being applied to the optical input.

In some embodiments, the modulator junction voltage with no net current injection of extraction is in the range of 0.7 to 0.9 volts with the coherent light beam being applied to the optical input.

In some embodiments, the modulator junction voltage with no net current injection of extraction is 0.8 volts with the coherent light beam being applied to the optical input.

In another aspect, the present disclosure provides a method of fabricating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, including determining the wavelength of the continuous wave coherent light beam to be applied to the modulator; determining the gain of an optical signal as a function of wavelength for various predetermined compositions of the waveguide layer; and fabricating the waveguide layer with a specific composition so that the estimated gain peak of an optical signal as a function of wavelength is greater than the predetermined wavelength of the continuous wave coherent light beam to be applied to the modulator.

In some embodiments, the estimated gain peak of an optical signal in the waveguide layer is between 20 and 40 nm greater than the wavelength of the continuous wave coherent light beam to be applied to the modulator.

In another aspect, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, including forming a laser resonator in the first semiconductor region so as to operate at an optical output wavelength; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; determining the material composition of the quantum well region so that the modulator is transparent at an estimated gain peak wavelength that is greater than the output wavelength of the laser resonator by a predetermined amount; and fabricating the modulator with said determined material composition.

In some embodiments, the estimated gain peak wavelength associated with the modulator is between 20 and 40 nm greater than the output wavelength of the light applied to the modulator.

In another aspect, the present disclosure provides a method of performing an electroluminescence measurement on the waveguide structure.

In some embodiments, the electroluminescence measurement on the waveguide structure is made prior to fabrication of the laser resonator.

In some embodiments, the optical output wavelength of the laser resonator is determined by a grating in the laser resonator, and the grating is formed so that the estimated gain peak wavelength associated with the laser resonator is between 20 and 40 nm less than the estimated gain peak wavelength at which the modulator region is transparent.

In another aspect, the present disclosure provides an electro-optical arrangement comprising a semiconductor device including: (a) a first semiconductor region including a laser resonator operable to produce a coherent light output in response to current injection; and (b) a second semiconductor region disposed adjacent to the first semiconductor region and separated therefrom by a channel, the second semiconductor region having the same composition as the first semiconductor region, and including an optical input optically coupled to the first semiconductor region for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated by the signal.

In some embodiments, the first bias potential is a positive bias, and the second bias is in the range of 0.7 to 0.9 volts with the coherent light output being applied to the optical input.

In some embodiments, the semiconductor region comprises an InP semiconductor waveguide structure, or other III-V semiconductor waveguide structure. Examples can include, e.g., InGaAsP or InAlGaAs lattice-matched to an InP substrate, forming multi-quantum wells or optical confinement heterostructures.

In some embodiments, the first semiconductor region comprises an InP semiconductor gain structure, or other III-V semiconductor gain structure, having a mirrored first end region and a second end region disposed adjacent to the modulator. Examples can include, e.g., InGaAsP or InAlGaAs lattice-matched to an InP substrate, forming multi-quantum wells or optical confinement heterostructures.

In some embodiments, the semiconductor device includes a first electrode disposed over the InP semiconductor gain structure, or other III-V semiconductor gain structure, and a second electrode disposed over the InP semiconductor waveguide structure, or other III-V semiconductor waveguide structure.

In some embodiments, the bias current applied to the second electrode is zero.

In some embodiments, the bias voltage applied to the second electrode is plus or minus 0.1 volts from the value of the voltage that would have occurred if the modulator is pumped by the source laser, and no current is injected or extracted from the electrode coupled to the modulator.

In another aspect, the present disclosure provides a method of fabricating an optical modulator including a semiconductor device having an optical input for receiving a continuous wave coherent light beam having a predetermined power, a waveguide in the semiconductor device for transferring the light beam, an electrode disposed on the semiconductor device and connected to a radio frequency signal input and a bias potential for creating an electric field in the waveguide and optically modulating the light beam as the beam traverses the waveguide, and an optical output in the semiconductor device connected to the waveguide for transferring the modulated optical signal, comprising the steps of specifying the wavelength of the continuous wave coherent light beam to be applied to the modulator; determining the gain of an optical signal in the waveguide as a function of wavelength for various predetermined compositions of the waveguide and fabricating the waveguide with a specific composition so that the estimated gain peak of an optical signal as a function of wavelength is greater by more than 10 nm than the specified wavelength of the continuous wave coherent light beam to be applied to the modulator.

In another aspect, the present disclosure provides a method of fabricating an optical modulator including a semiconductor device having an optical input for receiving a continuous wave coherent light beam having a predetermined power, a waveguide in the semiconductor device for transferring the light beam, an electrode disposed on the semiconductor device and connected to a radio frequency signal input and a bias potential for creating an electric field in the waveguide and optically modulating the light beam as the beam traverses the waveguide, and an optical output in the semiconductor device connected to the waveguide for transferring the modulated optical signal, comprising the steps of specifying the wavelength of the continuous wave coherent light beam to be applied to the modulator; making an electroluminescence measurement of the modulator at open circuit conditions for determining the gain of an optical signal in the waveguide as a function of wavelength; fabricating the waveguide with a specific composition so that the estimated gain peak of an optical signal as a function of wavelength is greater by more than 10 nm than the specified wavelength of the continuous wave coherent light beam to be applied to the modulator.

In another aspect, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and making an electroluminescence measurement of the modulator at open circuit conditions for determining the gain of an optical signal in the waveguide as a function of wavelength; determining the material composition of the quantum well region so that the modulator is optically transparent to the coherent light output at an estimated gain peak wavelength that is greater than the predetermined wavelength by a predetermined amount, and fabricating the modulator with said determined material composition.

In some embodiments, the predetermined amount of the difference in wavelength is greater than 10 nm but less than 50 nm.

In another aspect, the present disclosure provides an electro-optical arrangement comprising a semiconductor device including: (a) a first semiconductor region including a laser resonator operable to produce a continuous wave coherent light output in response to current injection at a specified wavelength; and (b) a second semiconductor region disposed adjacent to the first semiconductor region and separated therefrom by a channel, the second semiconductor region having the same composition as the first semiconductor region, and including an optical input optically coupled to the first semiconductor region for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam transmitted in the second semiconductor region is optically modulated by the signal so that the estimated gain peak of the optical signal as a function of wavelength is greater by more than 10 nm than the specified wavelength of the continuous wave coherent light beam applied to the modulator.

In another aspect, the present disclosure provides a an optical modulator comprising an information-containing radio frequency signal input; a semiconductor device having an optical input optically for receiving the coherent light beam, and an electrode connected to said radio frequency signal input and having a modulated bias potential so that current is generated in the semiconductor device and extracted therefrom, fabricating the waveguide with a specific composition so that while the coherent light beam is optically modulated by the signal so that the estimated gain peak of the optical signal as a function of wavelength is greater by more than 10 nm than the specified wavelength of the continuous wave coherent light beam applied to the modulator.

In another aspect, the present disclosure provides a method of fabricating an optical modulator comprising an information-containing radio frequency signal input; a semiconductor device having an optical input optically for receiving the coherent light beam, and an electrode connected to said radio frequency signal input and having a modulated bias potential so that current is generated in the semiconductor device and extracted therefrom, while the coherent light beam is optically modulated by the signal so that the estimated gain peak of the optical signal as a function of wavelength is greater by more than 10 nm than the specified wavelength of the continuous wave coherent light beam applied to the modulator.

In another aspect, the present invention provides an electro-optical arrangement comprising a semiconductor device including a first semiconductor region including a laser resonator operable to produce a coherent light output in response to current injection; and a second semiconductor region disposed adjacent to the first semiconductor region and separated therefrom by a channel, the second semiconductor region having an optical input optically coupled thereto for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated so that the estimated gain peak of the optical signal as a function of wavelength is greater by more than 10 nm than the specified wavelength of the continuous wave coherent light beam applied to the modulator.

In another aspect, the present invention provides a laser transmitter for optical communications comprising a first semiconductor device including a laser resonator operable to produce a coherent light output in response to current injection at a first bias potential; a second semiconductor device disposed adjacent to the first semiconductor device and having an optical input optically coupled thereto for receiving the coherent light output, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated so that the estimated gain peak of the optical signal as a function of wavelength is greater by more than 10 nm than the specified wavelength of the continuous wave coherent light beam applied to the modulator.

In another aspect, the present invention provides a method of fabricating a laser transmitter for optical communications comprising a first semiconductor device including a laser resonator operable to produce a coherent light output in response to current injection at a first bias potential; a second semiconductor device disposed adjacent to the first semiconductor device and having an optical input optically coupled thereto for receiving the coherent light output, the second semiconductor device being electrically biased at a lower second bias potential than the first semiconductor device and electrically coupled to an radio frequency information-containing signal source, so that current is generated in the second semiconductor device, while the coherent light beam is optically modulated so that the estimated gain peak of the optical signal as a function of wavelength is greater by more than 10 nm than the specified wavelength of the continuous wave coherent light beam applied to the modulator.

In another aspect, the present invention provides a method of operating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, comprising: applying a continuous wave coherent light beam to the optical input; and applying a bias voltage to the electrode so that the coherent light beam is optically modulated and the estimated gain peak of the optical signal as a function of wavelength is greater by more than 30 nm than the specified wavelength of the continuous wave coherent light beam applied to the modulator.

In another aspect, the present invention provides a method of making an optical modulator by determining the material composition of the quantum well region in the waveguide portion of the modulator so that the modulator is transparent at an estimated gain peak wavelength that is greater than the predetermined wavelength by a predetermined amount, and fabricating the modulator with the determined material composition.

In some embodiments, the operating wavelength of the modulator is from about 1520 to about 1570 nm. In some embodiments, the operating wavelength of the modulator is from 1540 to 1550 nm.

In some embodiments, the estimated gain peak of an optical signal as a function of wavelength is greater by more than 20 nm than the specified wavelength of the continuous wave coherent light beam to be applied to the modulator.

In some embodiments, the estimated gain peak of an optical signal as a function of wavelength is 30 nm greater than the specified wavelength of the continuous wave coherent light beam to be applied to the modulator.

In some embodiments, the operating wavelength of the modulator is at least 30 nm below the estimated gain peak wavelength.

In some embodiments, the operating wavelength of the modulator is from 30 to 40 nm below the estimated gain peak wavelength.

In some embodiments, the operating wavelength of the modulator is 40 nm below the estimated gain peak wavelength.

In some embodiments, the laser and the modulator are integrated on a single semiconductor substrate.

In another aspect, the bias potential applied to the laser is less than the bias potential applied to the modulator.

In some embodiments, the external electrical bias potential applied to the modulator is plus or minus 0.1 volts.

In some embodiments, the modulator is optically pumped by the light beam from the laser to a level of 0.8 volts.

In another aspect, in operation the modulator generates electrical current from the photovoltaic effect, which is withdrawn from the modulator.

In another aspect, the carrier density along the length of the semiconductor modulator in the direction of the optical beam is modulated, thereby optically modulating the cw optical beam entering the modulator.

In another aspect, the modulator comprises an InP semiconductor waveguide structure, or other III-V semiconductor waveguide structure. Examples can include, e.g., InGaAsP or InAlGaAs lattice-matched to an InP substrate, forming multi-quantum wells or optical confinement heterostructures.

In another aspect, the laser comprises an InP semiconductor gain structure, or other III-V semiconductor gain structure, having a mirrored first end region and a second end region disposed adjacent to the modulator. Examples can include, e.g., InGaAsP or InAlGaAs lattice-matched to an InP substrate, forming multi-quantum wells or optical confinement heterostructures.

In another aspect, the laser includes a first electrode disposed over the InP semiconductor gain structure, or other III-V semiconductor gain structure.

In another aspect, the present disclosure is also related generally to the phenomenon of Stimulated Brillouin Scattering (hereinafter SBS) in the light guide of an optical communication system and more particularly to a method and associated apparatus for adjusting and optimizing the SBS performance of such an optical communication system by using, in some embodiments, a 2.4 GHz signal applied to an electrode over the laser gain region, a 10 MHz signal applied to an electrode over the laser gain region, or both.

In some embodiments, the laser further comprises a signal source that applies a 2.4 GHz signal to the first electrode of the laser for SBS suppression, a 10 MHz signal to the first electrode of the laser for SBS suppression, or both. In some embodiments, the laser further comprises a signal source that applies a 2.4 GHz signal to the first electrode of the laser for SBS suppression, a 10 MHz signal to the second electrode of the laser for SBS suppression, or both.

In another aspect, the modulator includes second electrode disposed over the InP semiconductor waveguide structure, or other III-V semiconductor waveguide structure.

In another aspect, the laser and the modulator are integrated on a single semiconductor substrate, and a vertical gap extending approximately one micron into the substrate electrically separates the laser and the modulator. The laser and modulator are optically connected by a common optical waveguide.

Additional objects, advantages, and novel features of the present invention will become apparent to those skilled in the art form this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

Objects and advantages pertaining to modulated laser sources may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

These and other features and advantages of this invention will be better understood and more fully appreciated by reference to the following detailed description when considered in conjunction with the accompanying drawings, wherein.

Figure 1:
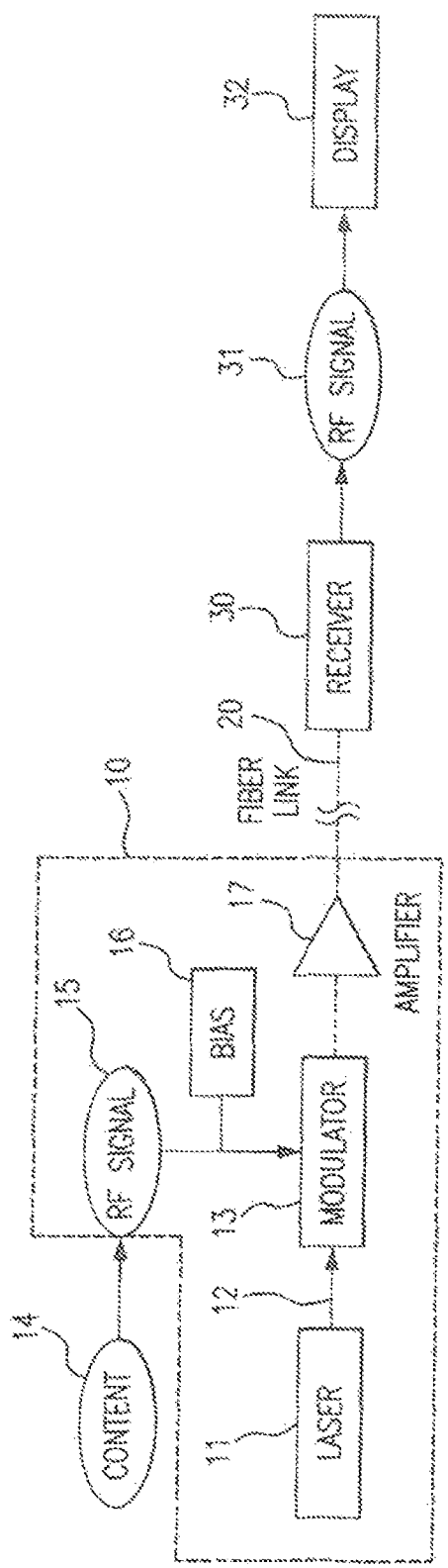
FIG. 1 is an example of an externally modulated optical transmission system known in the prior art.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is block diagram of a prior art optical transmission system in which information or "content" such as audio, video, data files, data bases, or other data is transmitted by an optical transmitter over an optical fiber link to a remote receiver, where the information content is reproduced, displayed, performed, executed or is otherwise utilized. The optical transmitter may be such as represented in U.S. Pat. No. 5,699,179 utilizing an external modulator. The transmitter, shown generally at 10, transmits an optical signal to a remote receiver 30 over an optical fiber path 20. The transmitter 10 includes a semiconductor laser 11, which produces a continuous wave (CW) output. Typical examples of such lasers are distributed feedback (DFB) lasers or Fabry-Perot lasers that produce an output optical beam at a wavelength of 1,550 nm. The un-modulated optical signal from the laser is coupled to a modulator 13 by optical fiber 12. The modulator 13 may be a single modulator such as a Mach-Zehnder modulator, a cascaded MZ modulator or more than one modulator such as in a feed-forward linearizer.

The information or content-containing signal 14, such as audio, video, or data, is initially converted into a broadband RF signal in a suitable channel or frequency band for transmission, such as an amplitude modulated vestigial sideband (AM-SDB) cable television (CATV) or video signal, or a digital signal such as a quadrature amplitude modulated (QAM) symbols which represents the data in digital format. The broadband RF signal 15 is applied to the modulator 13 via a terminal or electrode on its surface. An electrical bias 16 is also applied to the modulator 13.

The modulated optical signal which carries the video data may, in some embodiments, be coupled to an amplifier 17, which in turn is coupled to the fiber link 20. The amplifier 17 is typically an erbium doped fiber amplifier (EDFA). The amplified optical signal is transmitted over the fiber optical transmission link 20 to the receiver 30. The optical fiber transmission link 20 may be a long-distance link extending up to 100 km. In this case, line amplifiers such as EDFA 17 may be provided at spaced intervals along in the line in order to boost the signal to desired levels. At the receiver 30, an amplifier (not shown) may also be provided to boost the incoming optical signal. The boosted signal is then applied to a photodetector and demodulated at the receiver 30 to an RF electrical signal 31, which is applied to a terminal or display 32 where the original audio, video or data signal is reproduced at the remote location.

Figure 2:
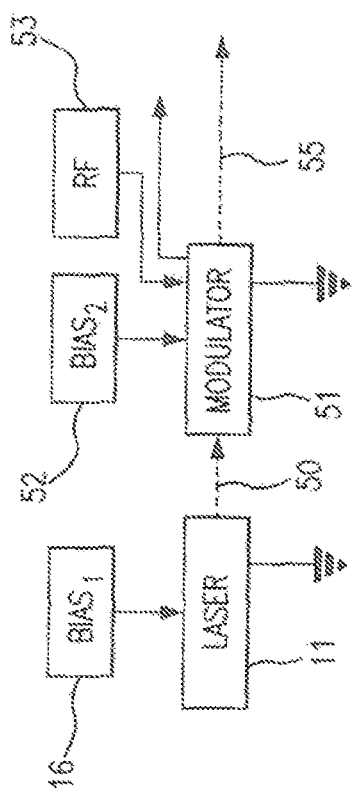
FIG. 2 is a first embodiment of an external modulator coupled to a laser according to the present disclosure.

FIG. 2 is a first embodiment of an optical transmitter including an external modulator coupled to a laser according to the present disclosure. There is depicted a semiconductor laser 11, which produces a continuous wave (CW) output. The laser 11 is operated at an electrical bias which is denoted as Bias (1). The un-modulated optical beam from the laser is coupled to an external modulator 51 by optical fiber 50, or by free space propagation. The modulator 51 is configured as a waveguide with electrodes coupled thereto, and operated at an electrical bias which is denoted as Bias (2), which is less than that Bias (1). In some embodiments, Bias (2) may be 0.8 volts, and Bias (1) may be 1.2 volts. In some embodiments, Bias (2) may be plus or minus 0.1 volts from the value of the voltage that would have occurred if the modulator is pumped by the source laser, and no current is injected or extracted from the electrode coupled to the modulator. In some embodiments, Bias (2) may be in the range of 0.7 to 0.9 volts. In some embodiments, Bias (2) may be in the range of 0.6 to 01.0 volts.

The information-containing RF signal 53 is also applied to the electrode of the modulator 51, so that during modulation the electrical bias applied to the modulator remains less than Bias (1). The electrical bias applied to the modulator 51 determines the amount of the cw light beam from the laser 11 that is absorbed by the modulator 51. In this way, the cw light beam entering the modulator is modified or modulated by the RF signal 53. An optical output is provided for transferring the modulated optical beam to an output fiber 55.

Figure 3:
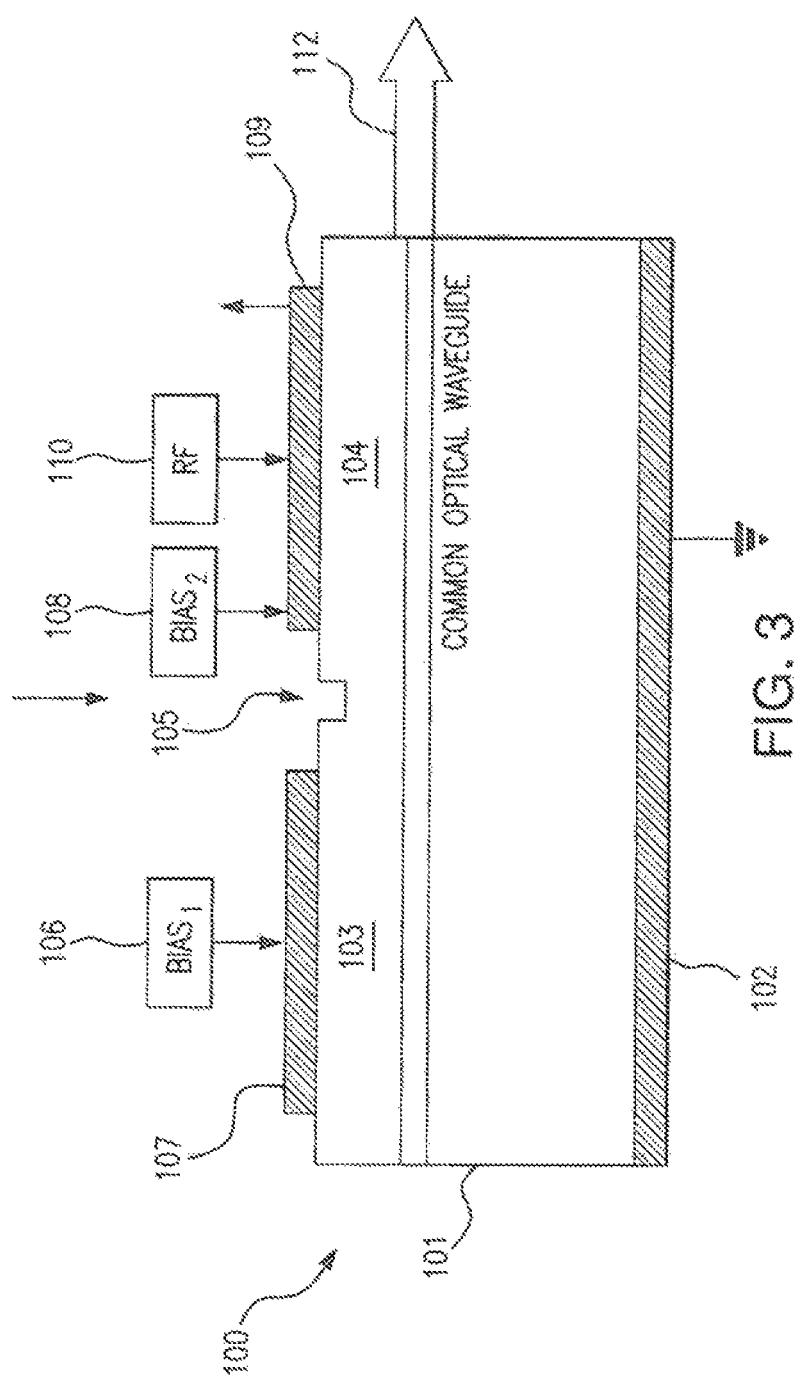
FIG. 3 is a second embodiment of an external modulator coupled to a laser according to the present disclosure.

FIG. 3 is a second embodiment of an external modulator coupled to a laser according to the present disclosure. The design and operation of the device of FIG. 3 is similar to that of FIG. 2, except that the laser and the modulator are implemented on a single integral semiconductor device. More particularly, there is depicted a semiconductor device 100 including a first semiconductor region 103 including a laser resonator 100 operable to produce a coherent light output in response to current injection; and a second semiconductor region 104 disposed adjacent to the first semiconductor region and separated therefrom by a channel 105. The second semiconductor region 104 has an optical input optically coupled thereto for receiving the coherent light output emitted from the first semiconductor region 103 and traversing the channel 105.

The first semiconductor device 103 is electrically biased by an electrode 107 on the top surface, which is connected to an external electrical bias potential 106 to inject current into the region 103. The second semiconductor device includes a waveguide layer for transferring the light beam from the optical input, an electrode 109 connected to a radio frequency signal input 110 and a bias potential 108 for creating an electric field in the waveguide and optically modulating the light beam as the beam traverses the waveguide. The second semiconductor device further includes an optical output 112 connected to the waveguide for transferring the modulated optical signal to an external fiber or other optical component. The bias voltage applied to the electrode 109 is appropriately selected so that the coherent light beam in the waveguide is optically modulated by the applied RF signal by modifying or modulating the absorption characteristic in the semiconductor device while the current generated in the waveguide as a result of photoabsorption of the continuous wave coherent light beam is extracted from the semiconductor device. The RF and DC currents generated are sunk by the RF source and DC bias respectively.

In some embodiments, the laser and the modulator comprise a single chip InP semiconductor device, or other III-V semiconductor single chip device. The laser may comprise an InP semiconductor (or other III-V semiconductor) gain structure region 103 having a mirrored first end region and a second end region disposed adjacent to the modulator (i.e., the waveguide structure 104). Suitable examples for the gain region 103 and waveguide structure 104 can include, e.g., InGaAsP or InAlGaAs lattice-matched to an InP substrate, forming multi-quantum wells or optical confinement heterostructures. The first electrode 107 is disposed over the InP semiconductor gain structure 103, and the second electrode 109 is disposed over the InP semiconductor (or other III-V semiconductor) waveguide structure 104, and a ground electrode 102 is provided extending over the bottom surface of the entire semiconductor structure.

In the embodiment in which the laser and the modulator are integrated on a single semiconductor substrate, and a vertical gap extending about 1 micron into the substrate electrically separates the laser and the modulator, or the first and second semiconductor regions 103 and 104.

In other embodiments, the laser and the modulator are implemented on two adjacent discrete semiconductor devices, such as depicted in FIG. 2. In some embodiments, an air gap having a width of less than 1 micron may separate the laser and the modulator devices.

The first semiconductor device 103 is electrically biased by an electrode 107 on the top surface, which is connected to an external electrical bias potential 106. The second semiconductor device 104 is electrically biased at a lower second bias potential than the first semiconductor device 103. The specific biasing of the second semiconductor device 104 and the operating current versus voltage characteristics of the device will be described in greater detail with reference to FIG. 4.

Figure 4:
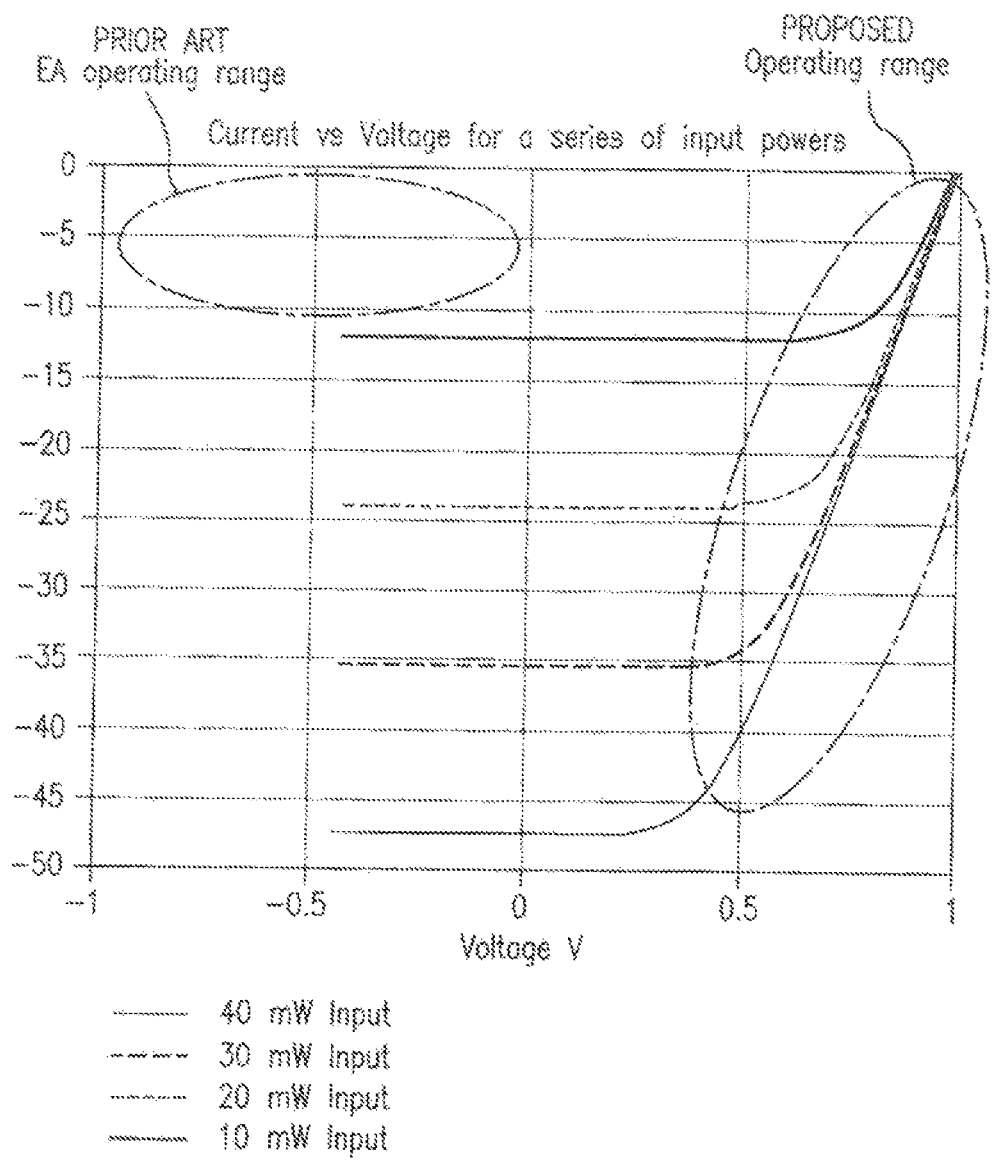
FIG. 4 is a graph of the current versus voltage operating characteristics of an electrooptical modulator for various input powers in the prior art and according to the present disclosure.

FIG. 4 is a graph of the current versus voltage operating characteristics of an electrooptical modulator for various input powers (i.e., 10 mW, 20 mW, 30 mW, and 40 mW) of the cw optical beam in the prior art and according to the present disclosure. In the prior art, in an electro-absorption modulator, the waveguide is biased to operate in a negative voltage, positive current region as shown by the dashed line region marked "PRIOR ART EA OPERATING RANGE". In the modulator according to the present disclosure, the waveguide is biased to operate in a positive voltage, higher negative current region as shown by the dashed line region marked "PROPOSED OPERATING RANGE".

In the absence of any applied bias signal, a small amount of the cw optical beam is absorbed in the modulator and this causes a steady-state carrier density to build up in the modulator. These carriers recombine with a typical lifetime of about one nanosecond. An equilibrium level is reached when the number of carriers generated by optical absorption balances the number lost through recombination. In an embodiment, the absorption is high when the carrier level is low and the absorption is low and when the carrier density is high. When the bias signal is applied, carriers are extracted from the modulator. This lowers the carrier density, and therefore increases absorption of the modulator. In particular, if a current of −10 mA is extracted from the modulator, then the absorption is increased by an amount required to produce that current of −10 mA. Similarly, if a current of −20 mA is extracted from the modulator, then the absorption is increased by an amount required to produce that current of −20 mA. Another way of describing the operation is that carriers in the semiconductor waveguide generated by the cw optical beam are excited into a conduction band and are extracted from the semiconductor region by an applied electrical bias field.

Figure 5:
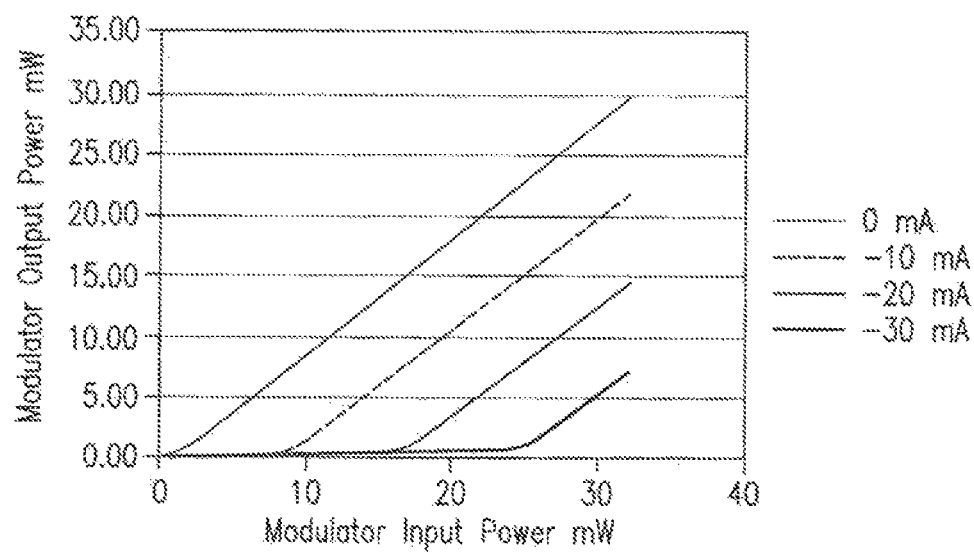
FIG. 5 is a graph depicting the modulator output power versus the modulator input power at various current operation levels according to the present disclosure.

FIG. 5 shows a graph of the output power vs input power for the modulator according to the present disclosure with the parameter being the current extracted from the modulator. Since the proposed modulator has a low RF impedance, it is possible to modulate it in a manner that is close to a current source modulation (at least down to the point that the output power is close to 0). As can be seen from the FIG. 5, this really modulates the saturation power of the device. When operated at a fixed input power of say 30 mW, the net effect is a modulation of the optical output power. The operation is analogous to an optical power subtraction device in which an amount of light corresponding to the extracted current is absorbed from the input cw optical beam. In effect, after the amount of light corresponding to the extracted current is absorbed, that absorption mechanism is saturated.

Figure 6:
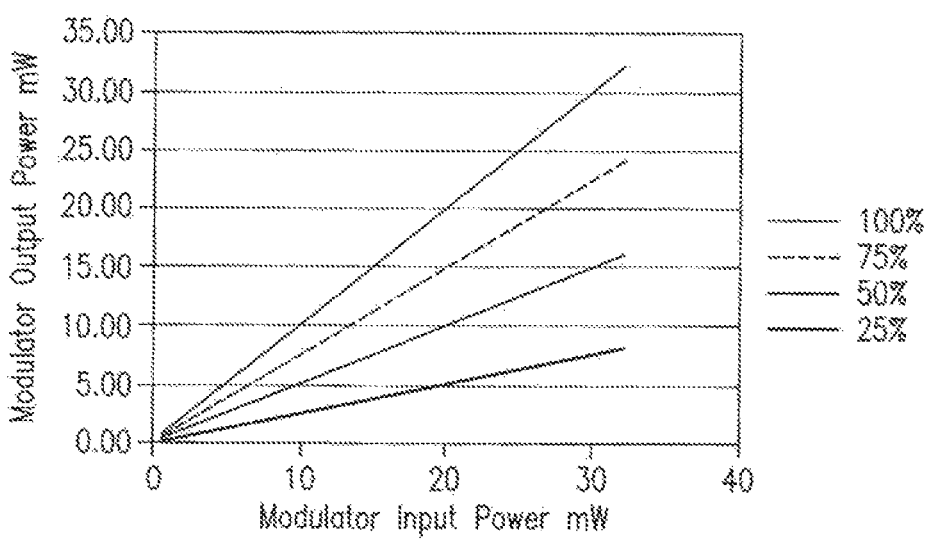
FIG. 6 is a graph depicting the modulator output power versus the modulator input power at various operation levels according to a Mach Zehnder or EA modulator known in the prior art.

The operation of the modulator of FIG. 5 should be contrasted with a traditional modulator where the optical transmission factor is modulated. FIG. 6 shows what happens with a MZ or EA type modulator. The parameter in this FIG. 6 is the transmission through the modulator. For a fixed input power of 30 mW, a modulated output similar to the output of the proposed modulator is produced. However, variation of the output optical power with input optical power with a fixed bias signal is substantially linear, in contrast to the saturation-type variation of the proposed modulator. This reflects the fundamentally different modulation mechanism involved in the proposed modulator.

Figure 7:
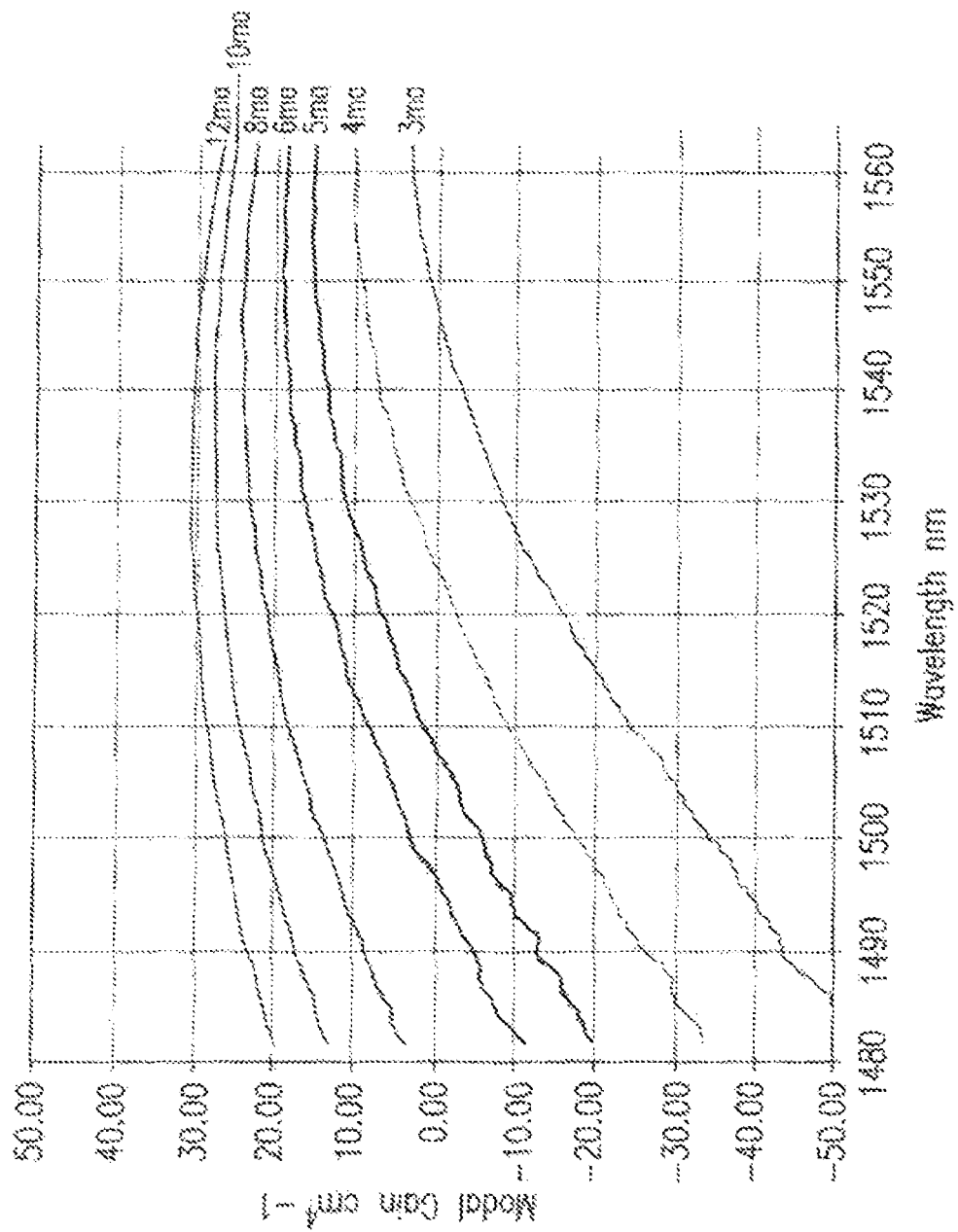
FIG. 7 is a graph depicting the modal gain versus wavelength showing the gain peak wavelength for a given composition of the modulator waveguide.

FIG. 7 is a graph depicting the modal gain versus wavelength showing the gain peak wavelength for a given composition of the modulator waveguide. It is noted that there are different maximum or peak values of the modal gain for different current values through the modulator.

Figure 8:
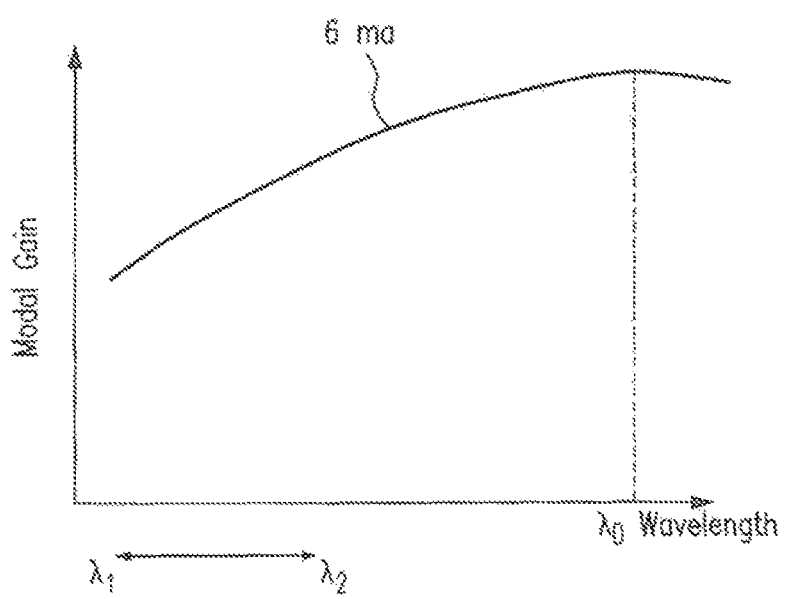
FIG. 8 is a graph depicting the modal gain versus wavelength showing the gain peak wavelength and a range of potential operating wavelengths for the design of a modulator waveguide.

FIG. 8 is a graph depicting the modal gain versus wavelength showing the gain peak wavelength and a range of potential operating wavelengths for the design of a modulator waveguide.

Figure 9:
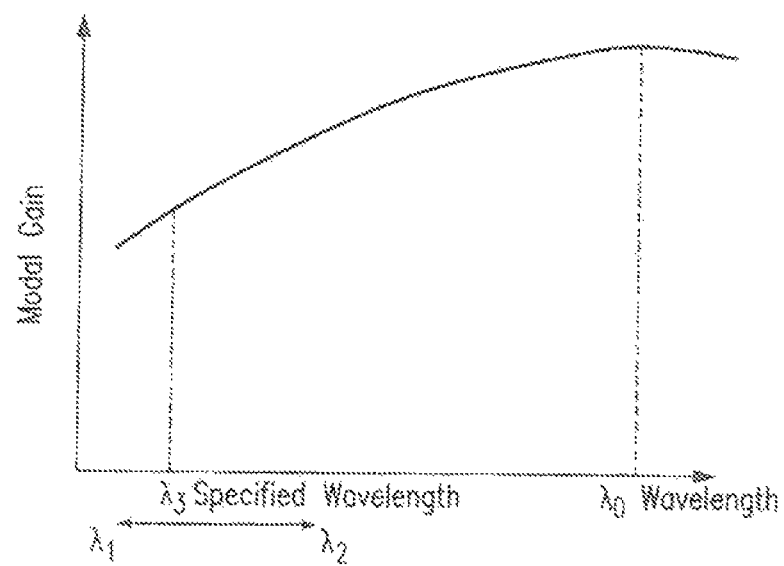
FIG. 9 is a graph depicting the modal gain versus wavelength showing the gain peak wavelength and a selected operating wavelength for a given composition of the modulator waveguide.

FIG. 9 is a graph depicting the modal gain versus wavelength showing the gain peak wavelength and a selected operating wavelength for a given composition of the modulator waveguide.

In the proposed device according to the present disclosure, the material in the modulator section 104 is mostly pumped by the light coming from the source laser 103 that is operating DC. In a test environment, one may evaluate the modulator under the open circuit condition where one is neither injecting nor extracting DC current from the modulator. Under this open circuit condition, the material in the modulator section 104 is pumped to give a carrier density just below the level for which the material becomes optically transparent or has no net absorption or gain. The modulator junction under this condition is at a voltage corresponding to about 0.8 volts forward bias (analogous to the open circuit voltage of a solar cell).

The modulator does not have to be used with the open circuit bias condition. One can either bias the modulator by injecting current, in which case the material will move towards optical gain or extracting current, in which case the absorption increases compared to the open circuit bias condition. The current values in the curves graphed in FIG. 7 are merely intended as nominal or representative to depict typical gain peak wavelengths at different current values, since the depicted data is derived from a prototype test structure that is only electrically pumped, unlike the proposed modulator that would be used in actual practice and which would be mostly optically pumped. Although experimentally one cannot directly measure the optical gain curves for the optically pumped case, the data is suggestive and it is believed that the corresponding curves for the optically pumped case move up and to the left for increasing current, similarly to the curves graphed in FIG. 7 for electrically pumped test structures.

The present disclosure does not specify the signal wavelength relative to the modulator gain curve, since that may depend upon other product design specifications and the customer application environment. However, one aspect of the present disclosure is the fabrication method for the design of an optical modulator and how to specify the wavelength of the material for given operational specifications or requirements. Two methods are reasonable and are embodiments of the present disclosure. One is determining the photoluminescence (PL) peak wavelength. In this case the material is optically pumped and the spectrum of the light emitted from the material is measured by commercially available photoluminescence instruments. This measurement of the photoluminescence (PL) peak wavelength not the same as measurement of the gain curve, but they are related. For example the material used for the gain data presented in FIG. 10 has a PL peak wavelength of 1574 nm. A second method would be to specify the peak of the gain curve under some specific pumping condition. No pumping at all is not a good experimental approach for specifying an estimated gain peak since there isn't any gain peak, the absorption just gets steadily larger as the wavelength is reduced. Pumping the modulator until there is a peak in the gain at some specific level is another way to try to specify this, but it is believed to be less well defined than the PL peak. One embodiment of the present disclosure therefore provides making a PL measurement and using the PL wavelength so determined as a method of characterizing the material. In terms of operation, one would want to have the signal wavelength be below the PL peak, which is different from the design of the semiconductor material in as EA modulator where the signal wavelength in the EA modulator is typically much greater than the peak PL wavelength. One embodiment of the present disclosure therefore provides the selection or specification of the operating wavelength that one is at least 10 nm below the PL peak. In some embodiments, the selection or specification of the operating wavelength is one that is 30 nm below the PL peak.

Figure 10:
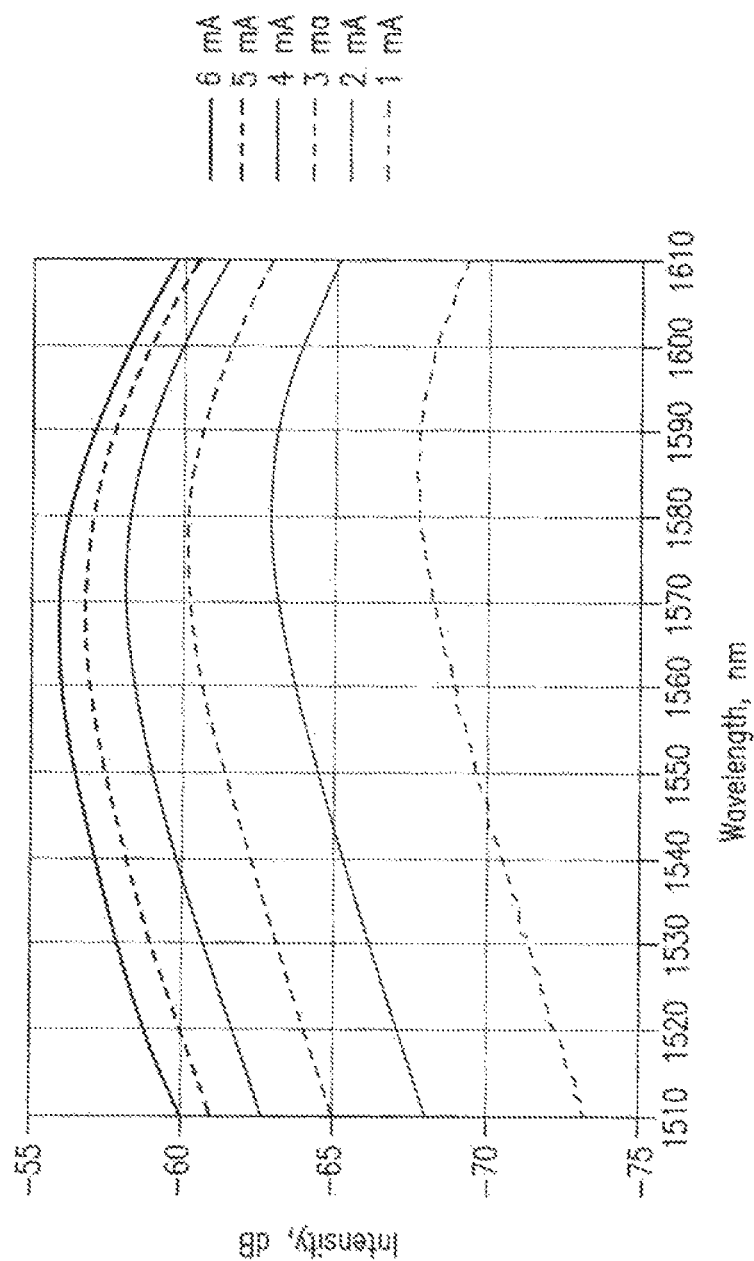
FIG. 10 is a graph depicting the modal gain versus wavelength showing the gain peak wavelength from an electroluminescence measurement of a specimen test modulator at various modulator current values.

FIG. 10 is a graph depicting the modal gain versus wavelength showing the gain peak wavelength from an electro luminescence (EL) measurement of a specimen test modulator at various modulator current values. In one embodiment of the present disclosure, the peak wavelength extrapolated to zero current is an appropriate and precise way to characterize the material. In this case illustrated in FIG. 10, the peak wavelength is about 1589 nm. This is not the same as the PL characterization which was 1574 nm for the same test wafer. In terms of the operating wavelengths that would use with this material, in one embodiment of the present disclosure, suitable wavelengths would be in the range of about 1520 nm about 1570 nm, or in the range of 1540 to 1550 nm. In another embodiment of the present disclosure, the operating wavelength would be at least 30 nm below the estimated gain peak wavelength. In another embodiment of the present disclosure, the operating wavelength would be in the range of 40 to 30 nm below the estimated gain peak wavelength.

Figure 11:
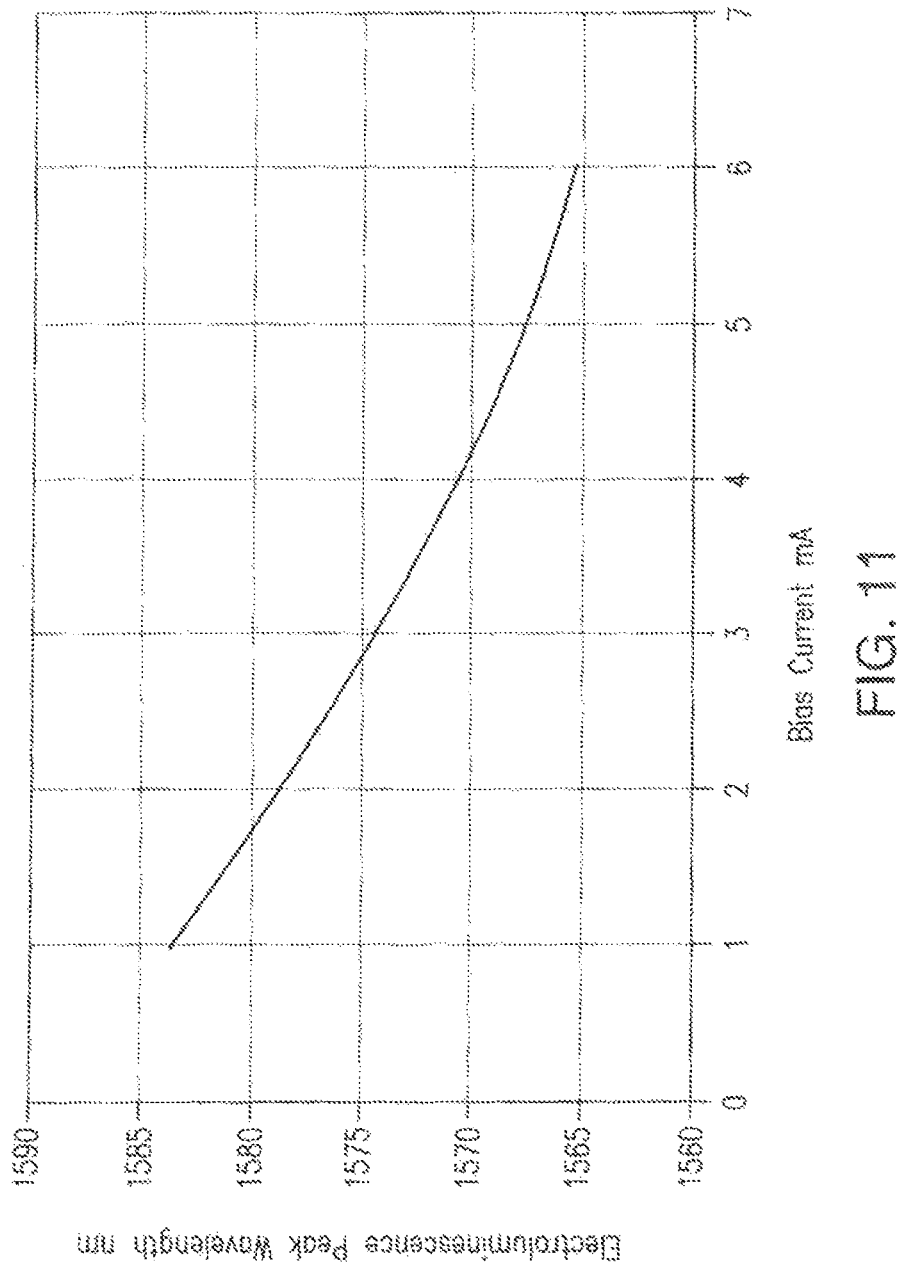
FIG. 11 is a graph depicting the gain peak wavelength versus current from an electroluminescence measurement of a specimen test modulator at various modulator current values.

FIG. 11 is a graph depicting the gain peak wavelength versus current from an electroluminescence measurement of a specimen test modulator at various modulator current values.

Figure 12:
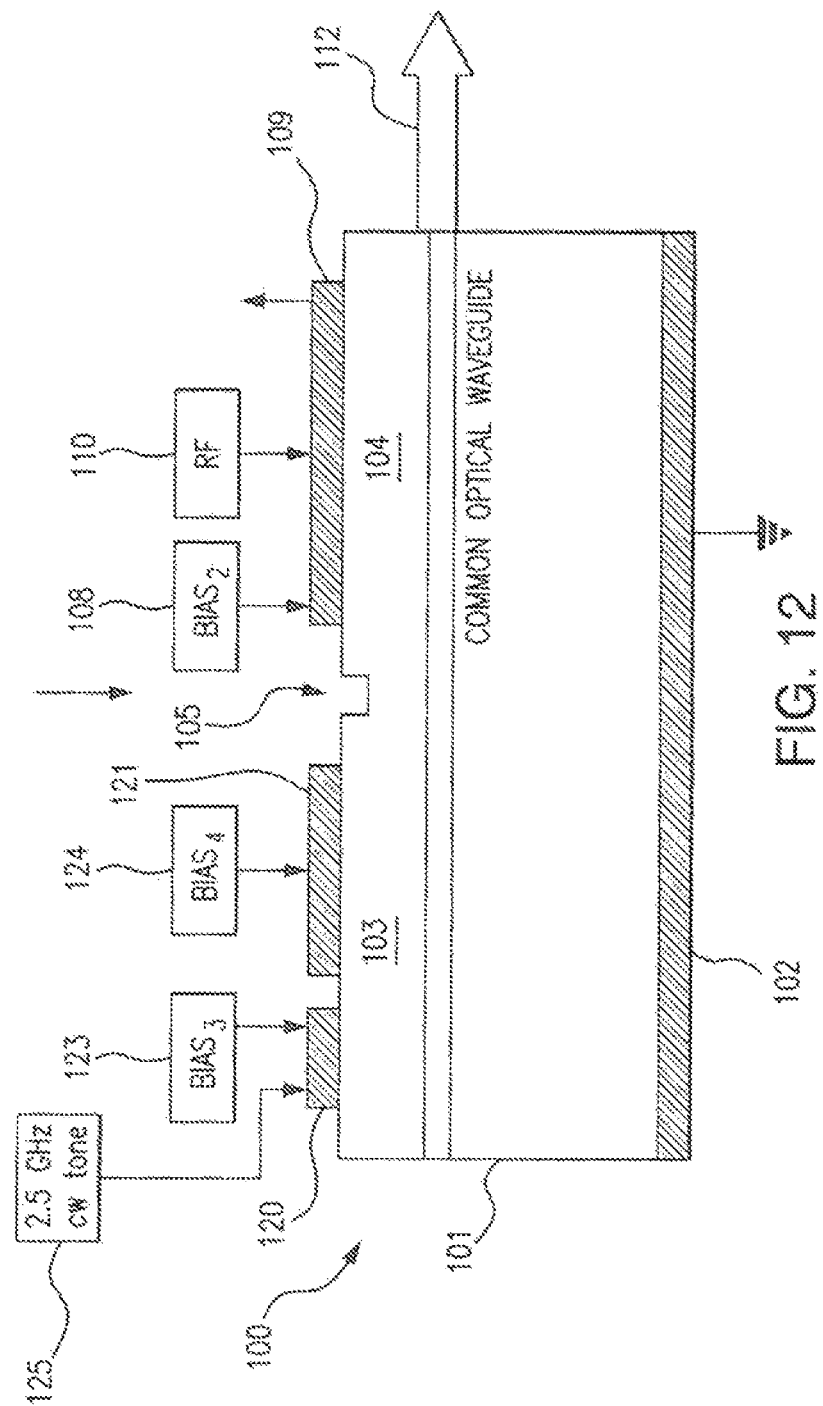
FIG. 12 is a cross-sectional of another embodiment of an external modulation coupled to a laser according to the present disclosure.

FIG. 12 is a cross-sectional view of another embodiment of the device in cross-section FIG. 3. In this embodiment, in place of a single electrode 107 shown in FIG. 3, there are two electrodes 120 and 121 which have lengths $L_1$ and $L_2$ respectively, and are spaced apart along the common optical waveguide over region 103. A first current $I_1$ is applied to the first electrode 120, and a second current $I_2$ is applied to the second electrode 121.

In some embodiments, the ratio $I_1/L_1$ is greater than $I_2/L_2$. To be more specific, in some embodiments, the ratio $I_1/L_1$ is at least 1.5 times greater than $I_2/L_2$, at least 2 times greater than $I_2/L_2$, or at least 5 times greater than $I_2/L_2$.

In some embodiments, $L_2$ is greater than $L_1$. To be more specific, in some embodiments $L_2$ is at least 3 times longer than $L_1$, at least 4 times longer than $L_1$, at least 5 times longer than $L_1$, or 4 to 6 times longer than $L_1$.

In some embodiments, a SBS signal source 150 is provided that generates a suitable signal applied to the first electrode 120 along with the current $I_1$. As we noted above, the impact of SBS in an optical network can be reduced in an externally modulated system if the optical signal's spectrum can be broadened since the energy per bandwidth is lowered. Thus, in some embodiments, the SBS signal source 150 is provided that functions for dithering the laser to broaden its spectrum. These "dither signals" are implemented to spread the output power of the associated laser over a wider range of optical wavelengths. In some embodiments, the SBS signal source 150 includes a high frequency signal that has a frequency at least twice that of the highest frequency component of the radio frequency information-containing signal source (so as to reduce the likelihood or severity of interference with the RF information-containing signal caused by the high frequency dither signal). In some embodiments, the SBS signal source 150 includes a low frequency signal that has a frequency less than about one third (or about one fifth, or about one tenth, or even less) of that of the lowest frequency component of the radio frequency information-containing signal source (so as to reduce the likelihood or severity of interference with the RF information-containing signal caused by the low frequency dither signal). In some examples, both high and low frequency dither signals are applied. In some examples, the low frequency dither signal can be applied to the electrode 121 along with the current $I_2$.

In some embodiments, the SBS signal source 150 generates signals at frequencies greater than about 2.4 GHz, or greater than about 2.5 GHz. In some embodiments, the SBS signal source 150 generates signals at frequencies less than about 15 MHz, less than about 10 MHz, less than about 5 MHz, less than about 1 MHz, less than about 500 kHz, less than about 100 kHz, or as low as about 10 kHz. In some embodiments the SBS signal source generates signals at frequencies both greater than about 2.4 GHz and less than about 10 MHz.

The ratios $I_1/L_1$ and $I_2/L_2$ (functionally equivalent to current densities applied through the electrodes 120 and 121, respectively) are suitably selected to achieve the appropriate level of SBS suppression for the optical network application. The higher current density represented by $I_1/L_1$ applied through electrode 120 (relative to the current density represented by $I_2/L_2$ applied through electrode 121) is employed so as to reduce or eliminate laser intensity fluctuations in the output of the laser gain region 103 arising from application of one or more dither signals to the electrode 120.

In some embodiments, instead of using an external modulator, the information-containing, electrical RF modulation signal can be applied to the second electrode 121 along with the laser drive current $I_2$, to directly modulate the output of the laser gain region 103. The dither signal(s) can still be applied in this arrangement to achieve a desired level of SBS suppression.

Based upon the foregoing characterization of the material, in one embodiment of the present disclosure, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising the steps of providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and determining the material composition of the quantum well region so that the modulator is transparent at an estimated gain peak wavelength that is greater than the predetermined wavelength by a predetermined amount, and fabricating the modulator with said determined material composition.

In another aspect, in one embodiment of the present disclosure, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising the steps of providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and determining the material composition of the quantum well region so that the modulator is transparent at an estimated gain peak wavelength that is greater than the predetermined wavelength by a predetermined amount, and fabricating the modulator with said determined material composition.

In another aspect, in one embodiment of the present disclosure, the present disclosure provides a method of fabricating a laser transmitter for optical communications including a semiconductor device including (a) a first semiconductor region for producing a coherent light output in response to current injection; and (b) a second semiconductor region disposed adjacent to the first semiconductor region and separated therefrom by a channel, the second semiconductor region having an optical input optically coupled thereto for receiving the coherent light output from the first semiconductor region, and an optical output connected to the second semiconductor region for transferring the modulated optical signal, comprising the steps of providing a predetermined wavelength value at which the transmitter is designed to operate; forming a laser resonator in the first semiconductor region; forming a semiconductor waveguide structure in the second semiconductor region for transferring the coherent light output from the first semiconductor region light beam; forming an optical modulator in the semiconductor waveguide structure, the optical modulator including an active layer including a quantum well region, and an electrode connected to a radio frequency signal input and a bias potential for creating an electric field in the waveguide structure so that the coherent light output is optically modulated as the light beam traverses the waveguide; and determining the material composition of the quantum well region so that the modulator is transparent at an estimated gain peak wavelength that is greater than the predetermined wavelength by a predetermined amount, and fabricating the modulator with said determined material composition.

In addition to the preceding, the following examples fall within the scope of the present disclosure or appended claims:

EXAMPLE 1

A method for operating a semiconductor laser, including a laser optical waveguide formed on a substrate and a reflector at a first end region of the laser optical waveguide, to generate a continuous-wave laser output optical signal, the method comprising: (a) applying a substantially constant first electrical laser drive current $I_1$ to a first laser electrode of length $L_1$ positioned over a first laser active region of the laser optical waveguide; (b) applying a substantially constant second electrical laser drive current $I_2$ to a second laser electrode of length $L_2$ positioned over a second laser active region of the laser optical waveguide; and (c) applying a time-varying wavelength-dithering current to the first electrode, wherein: (d) the laser output optical signal is emitted from a laser optical signal output at a second end region of the laser optical waveguide and is characterized by a laser output optical power level and a laser optical signal wavelength; (e) applying the laser-dithering current results in spectral broadening of the laser output optical signal; and (f) $I_1/L_1$ is greater than $I_2/L_2$.

EXAMPLE 2

The method of Example 1 wherein $I_1/L_1$ is at least 1.5 times greater than $I_2/L_2$.

EXAMPLE 3

The method of Example 1 wherein $I_1/L_1$ is at least two times greater than $I_2/L_2$.

EXAMPLE 4

The method of Example 1 wherein $I_1/L_1$ is at least five times greater than $I_2/L_2$.

EXAMPLE 5

The method of any one of Examples 1 through 4 wherein $L_2$ is at least three times longer than $L_1$.

EXAMPLE 6

The method of any one of Examples 1 through 4 wherein $L_2$ is at least four times longer than $L_1$.

EXAMPLE 7

The method of any one of Examples 1 through 4 wherein $L_2$ is at least five times longer than $L_1$.

EXAMPLE 8

The method of any one of Examples 1 through 7 wherein the semiconductor laser includes InP.

EXAMPLE 9

The method of any one of Examples 1 through 8 wherein the substrate includes InP and the laser optical waveguide includes one or more III-V semiconductor materials.

EXAMPLE 10

The method of any one of Examples 1 through 9 wherein each one of the first and second laser active regions includes a multi-quantum-well structure.

EXAMPLE 11

The method of any one of Examples 1 through 10 wherein the laser optical signal wavelength is between about 1520 nm and about 1570 nm.

EXAMPLE 12

The method of any one of Examples 1 through 11 wherein the laser optical signal wavelength is between about 1540 nm and about 1550 nm.

EXAMPLE 13

The method of any one of Examples 1 through 12 further comprising launching the laser output optical signal into a single-mode optical fiber, wherein the wavelength-dithering current oscillates with an amplitude large enough that the resulting spectral broadening is sufficient to at least partly suppress stimulated Brillouin scattering of the laser output optical signal propagating in the optical fiber.

EXAMPLE 14

The method of any one of Examples 1 through 13 wherein the wavelength-dithering current oscillates at a frequency greater than about 2.4 GHz.

EXAMPLE 15

The method of any one of Examples 1 through 14 wherein the wavelength-dithering current oscillates at a frequency less than about 10MHz.

EXAMPLE 16

The method of any one of Examples 1 through 15 wherein the wavelength-dithering current oscillates at a first frequency that is less than about 10 MHz and at a second frequency that is greater than about 2.4 GHz.

EXAMPLE 17

The method of any one of Examples 1 through 16 further comprising modulating the laser output optical signal with an electrical modulation signal that includes an information-carrying RF signal.

EXAMPLE 18

The method of Example 17 wherein the wavelength-dithering current oscillates at a frequency that is greater than two times any frequency component of the information-carrying RF signal.

EXAMPLE 19

The method of any one of Examples 17 or 18 wherein the wavelength-dithering current oscillates at a frequency that is less than about one third of any component of the information-carrying RF signal.

EXAMPLE 20

The method of any one of Examples 17 through 19 wherein the wavelength-dithering current oscillates at a first frequency that is less than about one third of any component of the information-carrying RF signal and at a second frequency that is greater than two times any frequency component of the information-carrying RF signal.

EXAMPLE 21

The method of any one of Examples 17 through 20 further comprising launching the modulated output optical signal into a single-mode optical fiber, wherein the wavelength-dithering current oscillates with an amplitude large enough that the resulting spectral broadening is sufficient to at least partly suppress stimulated Brillouin scattering of the modulator output optical signal propagating in the optical fiber.

EXAMPLE 22

The method of any one of Examples 17 through 21 further comprising applying the electrical modulation signal to an optical modulator arranged to receive the laser output optical signal and to produce therefrom a modulated optical output signal emitted from the modulator, wherein: (a) the modulator includes a modulator optical waveguide formed on the substrate and laser and modulator waveguides are arranged so that at least a portion of the laser optical output signal is launched to propagate along the modulator optical waveguide; (b) applying the electrical modulation signal to a modulator electrode positioned over a semiconductor modulator active region of the modulator optical waveguide modulates an optical transmission level of the input optical signal through the modulator resulting in the modulated output optical signal emitted from the modulator; (c) the optical modulator is characterized by a zero-current modulator optical transmission level that is less than 100% and occurs when charge carriers are neither injected into nor extracted from the modulator active region; (d) an electrical modulation signal level that causes charge carriers to be injected into the modulator active region results in a modulator optical transmission level higher than the zero-current modulator transmission level; and (e) an electrical modulation signal level that causes charge carriers to be extracted from the modulator active region results in a modulator optical transmission level lower than the zero-current modulator transmission level.

EXAMPLE 23

The method of Example 22 wherein: (f) the modulator active region is characterized by an estimated optical gain peak wavelength; and (g) the laser optical signal wavelength is shorter than the estimated optical gain peak wavelength.

EXAMPLE 24

The method of Example 23 wherein the estimated gain peak is a peak wavelength of an electroluminescence spectrum of the modulator active region measured without any optical input at an input voltage about equal to an open-circuit voltage produced by transmission of the laser output optical signal through the modulator.

EXAMPLE 25

The method of any one of Examples 22 or 23 wherein the laser optical waveguide includes a grating region having a grating period that results in the laser optical signal wavelength being shorter than the estimated optical gain peak wavelength.

EXAMPLE 26

The method of any one of Examples 22 through 25 wherein the laser optical waveguide includes a grating region having a grating period that results in the laser optical signal wavelength being more than about 10 nm shorter than a peak wavelength of an electroluminescence spectrum of the modulator active region.

EXAMPLE 27

The method of any one of Examples 22 through 26 wherein the laser optical waveguide includes a grating region having a grating period that results in the laser optical signal wavelength being between about 20 nm and about 40 nm shorter than a peak wavelength of an electroluminescence spectrum of the modulator active region.

EXAMPLE 28

The method of any one of Examples 22 through 27 wherein the laser and modulator electrodes are electrically separated by a vertical gap formed in semiconductor material between the electrodes.

EXAMPLE 29

The method of any one of Examples 22 through 28 wherein the laser and modulator optical waveguides are distinct portions of a common optical waveguide formed on the substrate.

EXAMPLE 30

The method of any one of Examples 22 through 29 wherein the optical modulator includes InP.

EXAMPLE 31

The method of any one of Examples 22 through 30 wherein the substrate includes InP and the modulator optical waveguide includes one or more III-V semiconductor materials.

EXAMPLE 32

The method of any one of Examples 22 through 31 wherein the modulator active region includes a multi-quantum-well structure.

EXAMPLE 33

The method of any one of Examples 22 through 32 wherein the modulation signal includes a substantially constant modulator bias voltage that is a positive modulator bias voltage, the laser bias voltage is a positive laser bias voltage, and the laser bias voltage is greater than the modulator bias voltage.

EXAMPLE 34

The method of any one of Examples 22 through 33 wherein the laser optical signal wavelength is between about 1520 nm and about 1570 nm.

EXAMPLE 35

The method of any one of Examples 22 through 34 wherein the laser optical signal wavelength is between about 1540 nm and about 1550 nm.

EXAMPLE 36

The method of any one of Examples 17 through 21 further comprising applying the electrical modulation signal to the second laser electrode along with the substantially constant second electrical laser drive current $I_2$.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

In the appended claims, any labelling of elements, steps, limitations, or other portions of a claim (e.g., first, second, etc., (a), (b), (c), etc., or (i), (ii), (iii), etc.) is only for purposes of clarity, and shall not be construed as implying any sort of ordering or precedence of the claim portions so labelled. If any such ordering or precedence is intended, it will be explicitly recited in the claim or, in some instances, it will be implicit or inherent based on the specific content of the claim. In the appended claims, if the provisions of 35 USC §112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A method for operating a semiconductor laser, including a laser optical waveguide formed on a substrate and a reflector at a first end region of the laser optical waveguide, to generate a continuous-wave laser output optical signal, the method comprising:
   (a) applying a substantially constant first electrical laser drive current $I_1$ to a first laser electrode of length $L_1$ positioned over a first laser active region of the laser optical waveguide;
   (b) applying a substantially constant second electrical laser drive current $I_2$ to a second laser electrode of length $L_2$ positioned over a second laser active region of the laser optical waveguide; and
   (c) applying a time-varying wavelength-dithering current to the first electrode,
   wherein:
   (d) the laser output optical signal is emitted from a laser optical signal output at a second end region of the laser optical waveguide and is characterized by a laser output optical power level and a laser optical signal wavelength;
   (e) applying the laser-dithering current results in spectral broadening of the laser output optical signal; and
   (f) $I_1/L_1$ is greater than $I_2/L_2$.

2. The method of claim 1 wherein $I_1/L_1$ is at least 1.5 times greater than $I_2/L_2$.

3. The method of claim 1 wherein $I_1/L_1$ is at least two times greater than $I_2/L_2$.

4. The method of claim 1 wherein $I_1/L_1$ is at least five times greater than $I_2/L_2$.

5. The method of claim 1 wherein $L_2$ is at least three times longer than $L_1$.

6. The method of claim 1 wherein $L_2$ is at least four times longer than $L_1$.

7. The method of claim 1 wherein $L_2$ is at least five times longer than $L_1$.

8. The method of claim 1 wherein the semiconductor laser includes InP.

9. The method of claim 1 wherein the substrate includes InP and the laser optical waveguide includes one or more III-V semiconductor materials.

10. The method of claim 1 wherein each one of the first and second laser active regions includes a multi-quantum-well structure.

11. The method of claim 1 wherein the laser optical signal wavelength is between about 1520 nm and about 1570 nm.

12. The method of claim 1 wherein the laser optical signal wavelength is between about 1540 nm and about 1550 nm.

13. The method of claim 1 further comprising launching the laser output optical signal into a single-mode optical fiber, wherein the wavelength-dithering current oscillates with an amplitude large enough that the resulting spectral broadening is sufficient to at least partly suppress stimulated Brillouin scattering of the laser output optical signal propagating in the optical fiber.

14. The method of claim 1 wherein the wavelength-dithering current oscillates at a frequency greater than about 2.4 GHz.

15. The method of claim 1 wherein the wavelength-dithering current oscillates at a frequency less than about 10 MHz.

16. The method of claim 1 wherein the wavelength-dithering current oscillates at a first frequency that is less than about 10 MHz and at a second frequency that is greater than about 2.4 GHz.

17. The method of claim 1 further comprising modulating the laser output optical signal with an electrical modulation signal that includes an information-carrying RF signal.

18. The method of claim 17 wherein the wavelength-dithering current oscillates at a frequency that is greater than two times any frequency component of the information-carrying RF signal.

19. The method of claim 17 wherein the wavelength-dithering current oscillates at a frequency that is less than about one third of any component of the information-carrying RF signal.

20. The method of claim 17 wherein the wavelength-dithering current oscillates at a first frequency that is less than about one third of any component of the information-carrying RF signal and at a second frequency that is greater than two times any frequency component of the information-carrying RF signal.

21. The method of claim 17 further comprising launching the modulated output optical signal into a single-mode optical fiber, wherein the wavelength-dithering current oscillates with an amplitude large enough that the resulting spectral broadening is sufficient to at least partly suppress stimulated Brillouin scattering of the modulator output optical signal propagating in the optical fiber.

22. The method of claim 17 further comprising applying the electrical modulation signal to an optical modulator arranged to receive the laser output optical signal and to produce therefrom a modulated optical output signal emitted from the modulator, wherein:
  (a) the modulator includes a modulator optical waveguide formed on the substrate and laser and modulator waveguides are arranged so that at least a portion of the laser optical output signal is launched to propagate along the modulator optical waveguide;
  (b) applying the electrical modulation signal to a modulator electrode positioned over a semiconductor modulator active region of the modulator optical waveguide modulates an optical transmission level of the input optical signal through the modulator resulting in the modulated output optical signal emitted from the modulator;
  (c) the optical modulator is characterized by a zero-current modulator optical transmission level that is less than 100% and occurs when charge carriers are neither injected into nor extracted from the modulator active region;
  (d) an electrical modulation signal level that causes charge carriers to be injected into the modulator active region results in a modulator optical transmission level higher than the zero-current modulator transmission level; and
  (e) an electrical modulation signal level that causes charge carriers to be extracted from the modulator active region results in a modulator optical transmission level lower than the zero-current modulator transmission level.

23. The method of claim 22 wherein:
  (f) the modulator active region is characterized by an estimated optical gain peak wavelength; and
  (g) the laser optical signal wavelength is shorter than the estimated optical gain peak wavelength.

24. The method of claim 23 wherein the estimated gain peak is a peak wavelength of an electroluminescence spectrum of the modulator active region measured without any optical input at an input voltage about equal to an open-circuit voltage produced by transmission of the laser output optical signal through the modulator.

25. The method of claim 23 wherein the laser optical waveguide includes a grating region having a grating period that results in the laser optical signal wavelength being shorter than the estimated optical gain peak wavelength.

26. The method of claim 22 wherein the laser optical waveguide includes a grating region having a grating period that results in the laser optical signal wavelength being more than about 10 nm shorter than a peak wavelength of an electroluminescence spectrum of the modulator active region.

27. The method of claim 22 wherein the laser optical waveguide includes a grating region having a grating period that results in the laser optical signal wavelength being between about 20 nm and about 40 nm shorter than a peak wavelength of an electroluminescence spectrum of the modulator active region.

28. The method of claim 22 wherein the laser and modulator electrodes are electrically separated by a vertical gap formed in semiconductor material between the electrodes.

29. The method of claim 22 wherein the laser and modulator optical waveguides are distinct portions of a common optical waveguide formed on the substrate.

30. The method of claim 22 wherein the optical modulator includes InP.

31. The method of claim 22 wherein the substrate includes InP and the modulator optical waveguide includes one or more III-V semiconductor materials.

32. The method of claim 22 wherein the modulator active region includes a multi-quantum-well structure.

33. The method of claim 22 wherein the modulation signal includes a substantially constant modulator bias voltage that is a positive modulator bias voltage, the laser bias voltage is a positive laser bias voltage, and the laser bias voltage is greater than the modulator bias voltage.

34. The method of claim 22 wherein the laser optical signal wavelength is between about 1520 nm and about 1570 nm.

35. The method of claim 22 wherein the laser optical signal wavelength is between about 1540 nm and about 1550 nm.

36. The method of claim 17 further comprising applying the electrical modulation signal to the second laser electrode along with the substantially constant second electrical laser drive current $I_2$.

* * * * *